(12) United States Patent
Inoue (10) Patent No.: US 8,724,371 B2
(45) Date of Patent: *May 13, 2014

(54) SEMICONDUCTOR MEMORY DEVICE AND MEMORY CELL VOLTAGE APPLICATION METHOD

(71) Applicant: Kabushiki Kaisha Toshiba, Minato-ku (JP)

(72) Inventor: Hirofumi Inoue, Kamakura (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/906,650

(22) Filed: May 31, 2013

(65) Prior Publication Data

US 2013/0265816 A1 Oct. 10, 2013

Related U.S. Application Data

(63) Continuation of application No. 12/747,290, filed as application No. PCT/JP2008/066795 on Sep. 9, 2008, now Pat. No. 8,467,225.

(30) Foreign Application Priority Data

Dec. 10, 2007 (JP) .................................. 2007-317992

(51) Int. Cl.
*G11C 11/00* (2006.01)

(52) U.S. Cl.
USPC ............................. 365/148; 365/163; 365/205

(58) Field of Classification Search
USPC ................................ 365/148, 163, 205, 225.7
See application file for complete search history.

(56) References Cited

U.S. PATENT DOCUMENTS 4,795,657 A 1/1989 Formigoni et al.
5,576,990 A 11/1996 Camerlenghi et al.
(Continued)

FOREIGN PATENT DOCUMENTS

CN 1487529 A 4/2004
EP 1 965 391 A1 9/2008
(Continued)

OTHER PUBLICATIONS

Extended European Search Report issued Feb. 18, 2011, in Application No. / Patent No. 08858679.7-2210 / 2240935 PCT/JP2008066795.

(Continued)

*Primary Examiner* — Huan Hoang
(74) *Attorney, Agent, or Firm* — Oblon, Spivak, McClelland, Maier & Neustadt, L.L.P.

(57) ABSTRACT

A semiconductor memory device comprises a plurality of parallel word lines, a plurality of parallel bit lines formed crossing the plurality of word lines, and a plurality of memory cells arranged at intersections of the word lines and the bit lines. Each memory cell has one end connected to the word line and the other end connected to the bit line. The device also comprises a drive circuit operative to selectively apply a voltage for data read/write across the word line and the bit line. It further comprises a sense amplifier circuit connected to the plurality of bit lines and operative to read/write data stored in the memory cell. The device also comprises a bit-line drive auxiliary circuit operative to selectively adjust the potentials on the plurality of bit lines based on data read out of the memory cell by the sense amplifier circuit.

17 Claims, 7 Drawing Sheets

(56) References Cited

U.S. PATENT DOCUMENTS

| | | |
|---|---|---|
| 6,034,882 A | 3/2000 | Johnson et al. |
| 6,480,438 B1 | 11/2002 | Park |
| 6,753,561 B1 | 6/2004 | Rinerson et al. |
| 6,998,698 B2 | 2/2006 | Inoue et al. |
| 7,221,606 B2 | 5/2007 | Kang et al. |
| 7,561,486 B2 | 7/2009 | Kim et al. |
| 8,467,225 B2 * | 6/2013 | Inoue ............................ 365/148 |
| 2004/0022085 A1 | 2/2004 | Parkinson et al. |
| 2004/0114429 A1 | 6/2004 | Ehiro et al. |
| 2006/0067106 A1 | 3/2006 | Mori et al. |
| 2006/0176740 A1 | 8/2006 | Kim et al. |
| 2007/0236987 A1 | 10/2007 | Cho et al. |
| 2009/0097295 A1 | 4/2009 | Morimoto |
| 2009/0161421 A1 | 6/2009 | Cho et al. |
| 2010/0008133 A1 | 1/2010 | Cho et al. |
| 2010/0220510 A1 | 9/2010 | Shalvi |

FOREIGN PATENT DOCUMENTS

| | | |
|---|---|---|
| JP | 7 220491 | 8/1995 |
| JP | 2002-216482 A | 8/2002 |
| JP | 2004 185756 | 7/2004 |
| JP | 2005-522045 A | 7/2005 |
| JP | 2006 99882 | 4/2006 |
| WO | 2006 134732 | 12/2006 |

OTHER PUBLICATIONS

Office Action issued Oct. 24, 2011, in Korean Patent Application No. 10-2010-7012706 (with English-language translation).

Office Action issued May 8, 2012, in Japanese Patent Application No. 2007-317992 with English translation.

Office Action issued May 17, 2012, in Korean Patent Application No. 10-2010-7012706 with English translation.

Chinese Office Action issued Jul. 20, 2012 in Patent Application No. 200880119865.2 with English Translation.

Combined Taiwanese Office Action and Search Report issued Nov. 13, 2012, in Patent Application No. 097135507 (with English-language translation).

* cited by examiner

SEMICONDUCTOR MEMORY DEVICE AND MEMORY CELL VOLTAGE APPLICATION METHOD

CROSS-REFERENCE TO RELATED APPLICATIONS

This application is a continuation of and claims the benefit of priority under 35 U.S.C. §120 from U.S. patent application Ser. No. 12/747,290, filed Sep. 13, 2010, which is a National Stage of PCT/JP08/066,795, filed Sep. 9, 2008, and claims the benefit of priority under 35U.S.C. §119 from Japanese Patent Application No. 2007-317992, filed Dec. 10, 2007, the entire contents of each of which is incorporated herein by reference.

TECHNICAL FIELD

The present invention relates to a semiconductor memory device, and more particularly to a structure for compensating for voltage drops in memory cells in a semiconductor memory device and a method therefor.

BACKGROUND ART

Highly integrated and finely patterned semiconductor integrated circuits require formation of elements in a smaller area at a higher density. Particularly, in a semiconductor memory, formation of elements in a smaller area at a higher density to produce the bit unit price at a lower price is one of important subjects.

Even in a multivalue NAND flash memory or the lowest cost memory in the art, however, difficulty in processing and limits of field effect transistors in association with the reduction in production rule make it difficult to reduce the cost more than now.

On the other hand, methods of producing memory elements at higher density may provide a memory cell having a three-dimension type structure that uses no field effect transistor. Such the memory cell may include a diode or a non-ohmic element capable of restricting current in both directions, and a memory element such as a phase change memory, a resistance variable memory, and a conductance bridge memory.

In the cell of the three-dimension type, however, the resistance of the word line or bit line increases in association with the reduction in rule and causes a voltage drop. As a result, accurate operation voltages can not be applied to all memory cells as a large problem. Therefore, the minimum cell array unit can not be made larger and consequently the chip size can be hardly reduced.

Therefore, there are needs for technologies of compensating for variations in voltage drop in memory cells (for example, Patent Document 1).

[Patent Document 1] U.S. Pat. No. 6,480,438

DISCLOSURE OF INVENTION

Technical Problem

The present invention has an object to provide a high-reliability semiconductor memory device of which voltage drops in memory cells are compensated for.

Technical Solution

In an aspect the present invention provides a semiconductor memory device, comprising: a plurality of parallel word lines; a plurality of parallel bit lines formed crossing the plurality of word lines; a plurality of memory cells arranged at intersections of the word lines and the bit lines, each memory cell having one end connected to the word line and the other end connected to the bit line; a drive circuit operative to selectively apply a voltage for data read/write across the word line and the bit line; a sense amplifier circuit connected to the plurality of bit lines and operative to read/write data stored in the memory cell; and a bit-line drive auxiliary circuit operative to selectively adjust the potentials on the plurality of bit lines based on data read out of the memory cell by the sense amplifier circuit.

In another aspect the present invention provides a semiconductor memory device, comprising: a plurality of parallel word lines; a plurality of parallel bit lines formed crossing the plurality of word lines; a plurality of memory cells arranged at intersections of the word lines and the bit lines, each memory cell including a variable resistor operative to store a reversibly settable resistance as data, and a diode serially connected to the variable resistor; a drive circuit operative to selectively apply a voltage for data read/write across the word line and the bit line; a sense amplifier circuit connected to the plurality of bit lines and operative to read/write data stored in the memory cell; and a drive auxiliary circuit operative to selectively adjust the potentials on lines including any one of the plurality of word lines and bit lines based on data read out of the memory cell by the sense amplifier circuit.

In yet another aspect the present invention provides a memory cell voltage application method for adjusting voltages applied to memory cells arranged at intersections of a plurality of parallel word lines and a plurality of parallel bit lines, the method comprising: applying a certain voltage to a selected word line to read the potentials on a plurality of bit lines crossing the selected word line at a sense amplifier circuit; storing the potential read out at the sense amplifier circuit in a storage circuit as information on a memory cell; selectively applying a voltage-drop compensated voltage to the plurality of bit lines by driving a bit-line drive auxiliary circuit based on the information stored in the storage circuit to adjust the potentials on the plurality of bit lines.

Effect of the Invention

In accordance with the present invention, voltage drops in memory cells can be compensated for to provide a high-reliability semiconductor memory device.

BEST MODE FOR CARRYING OUT THE INVENTION

The embodiments associated with a semiconductor memory device of the present invention will now be described in detail with reference to the drawings.

[Entire Configuration]

Figure 1:
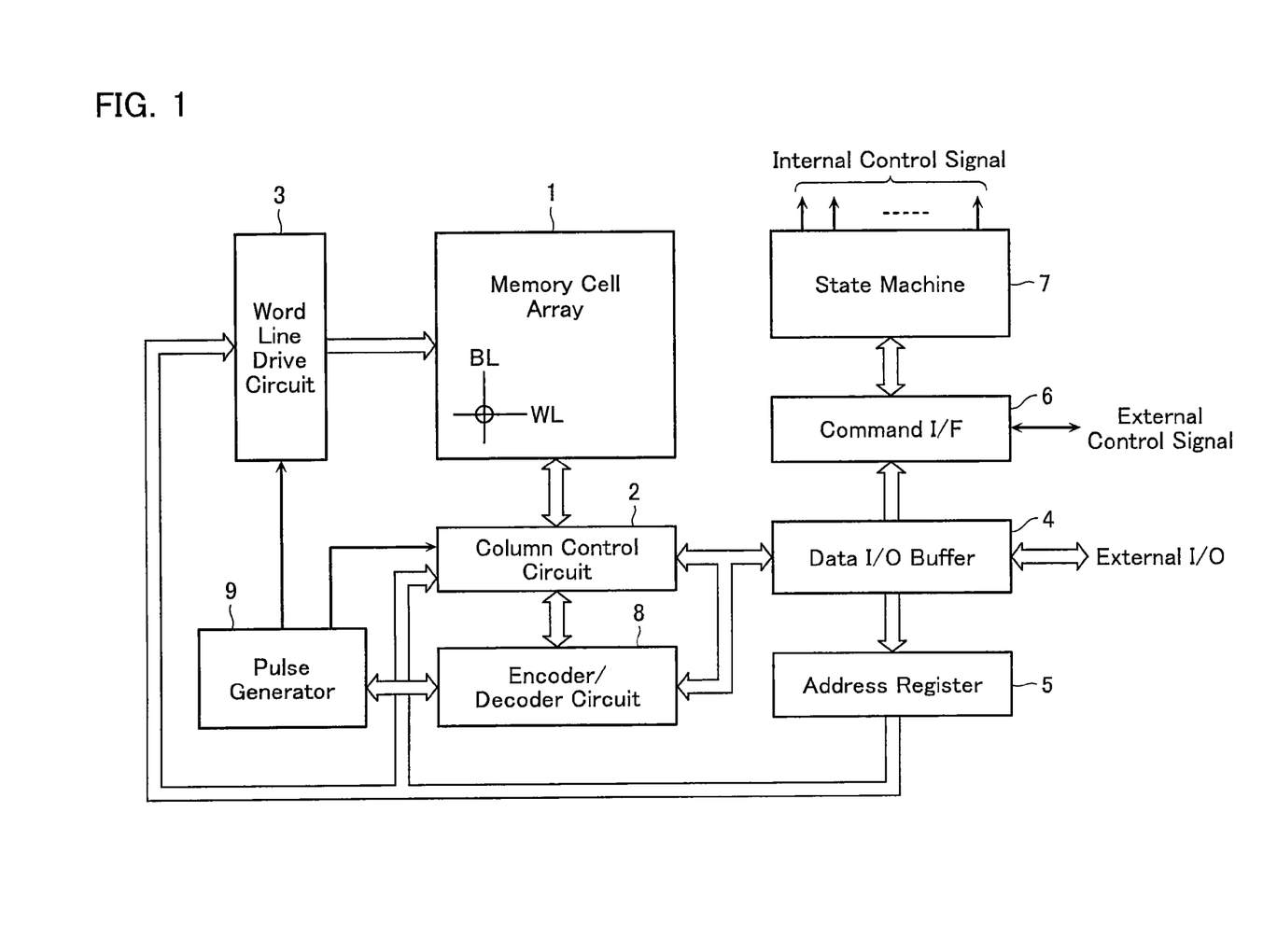
FIG. 1 is a block diagram of a semiconductor memory device according to one embodiment of the present invention.

FIG. 1 is a block diagram of a nonvolatile memory according to one embodiment of the present invention.

The nonvolatile memory comprises a memory cell array 1 of memory cells arranged in matrix, each memory cell including a later-described resistance variable element. A column control circuit 2 is provided on a position adjacent to the memory cell array 1 in the bit line BL direction. It controls the bit line BL in the memory cell array 1 to erase data from the memory cell, write data in the memory cell, and read data out of the memory cell. A word line drive circuit 3 is provided on a position adjacent to the memory cell array 1 in the word line WL direction. It selects the word line WL in the memory cell array 1 and applies voltages required to erase data from the memory cell, write data in the memory cell, and read data out of the memory cell.

A data I/O buffer 4 is connected to an external host, not shown, via an I/O line to receive write data, receive erase instructions, provide read data, and receive address data and command data. The data I/O buffer 4 sends received write data to the column control circuit 2 and receives read-out data from the column control circuit 2 and provides it to external. An address fed from external to the data I/O buffer 4 is sent to the column control circuit 2 and the word line drive circuit 3 via an address register 5. A command fed from the host to the data I/O buffer 4 is sent to a command interface 6. The command interface 6 receives an external control signal from the host and decides whether the data fed to the data I/O buffer 4 is write data, a command or an address. If it is a command, then the command interface transfers it as a received command signal to a state machine 7. The state machine 7 manages the entire nonvolatile memory to receive commands from the host, read, write, erase, and execute data I/O management.

The data fed from the host to the data I/O buffer 4 is transferred to an encoder/decoder circuit 8, of which output signal is fed into a pulse generator 9. In accordance with the input signal, the pulse generator 9 provides a write pulse with a certain voltage at a certain timing. The pulse generated at the pulse generator 9 is transferred to any lines selected by the column control circuit 2 and the word line drive circuit 3.

[Memory Cell Array and Peripheral Circuits]

Figure 2:
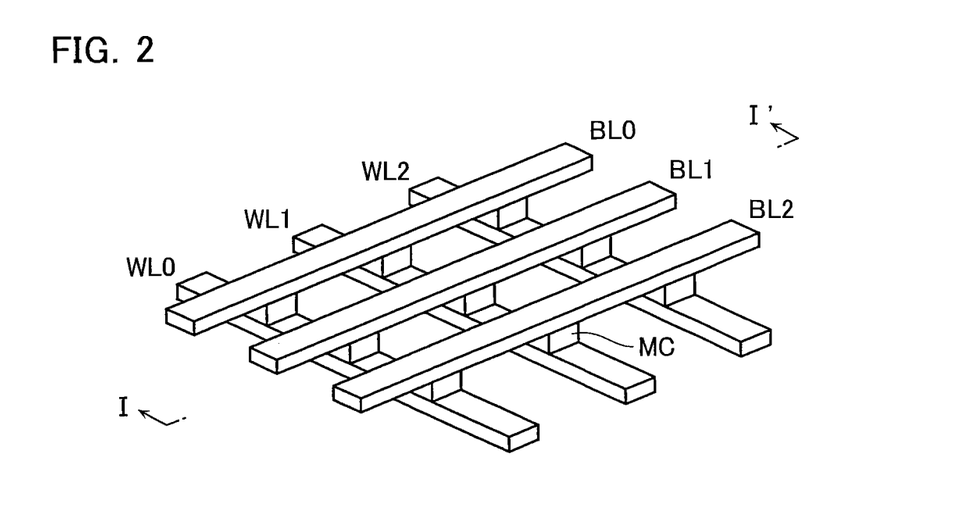
FIG. 2 is a perspective view of part of a memory cell array in the semiconductor memory device according to the same embodiment.
Figure 3:
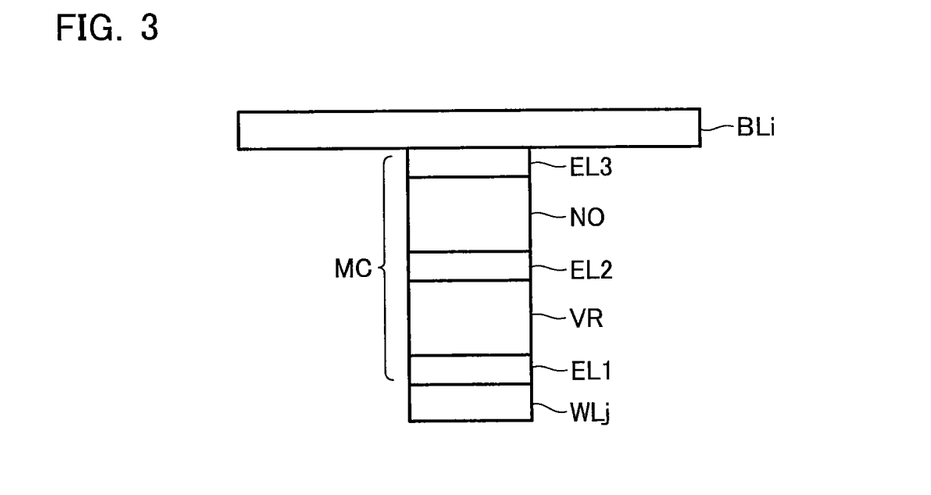
FIG. 3 is a cross-sectional view taken along I-I' line and seen from the direction of the arrow in FIG. 2.

FIG. 2 is a perspective view of part of the memory cell array 1, and FIG. 3 is a cross-sectional view of one memory cell taken along I-I' line and seen in the direction of the arrow in FIG. 2.

There are plural first lines or word lines WL0-WL2 disposed in parallel, which cross plural second lines or bit lines BL0-BL2 disposed in parallel. A memory cell MC is arranged at each intersection of both lines as sandwiched therebetween. Desirably, the first and second lines are composed of heat-resistive low-resistance material such as W, WSi, NiSi, CoSi.

The memory cell MC comprises a serial connection circuit of a variable resistor VR and a non-ohmic element NO as shown in FIG. 3.

The variable resistor VR can vary the resistance through current, heat, or chemical energy on voltage application. Arranged on an upper and a lower surface thereof are electrodes EL1, EL2 serving as a barrier metal layer and an adhesive layer. Material of the electrodes may include Pt, Au, Ag, TiAlN, SrRuO, Ru, RuN, Ir, Co, Ti, TiN, TaN, WN, LaNiO, Al, PtIrOx, PtRhOx, Rh/TaAlN. A metal film capable of achieving uniform orientation may also be interposed. A buffer layer, a barrier metal layer and an adhesive layer may further be interposed.

The variable resistor VR may include one such as chalcogenide that varies the resistance through the phase change between the crystal state and the non-crystal state (PRAM); one that comprises a composite compound containing cations of a transition element and varies the resistance through migration of cations or migration of hydrogen/oxygen ions; and one that varies the resistance when cations build a bridge (conducting bridge) (CBRAM).

The latter variable resistor VR may include a recording layer using a certain transition oxide of which high-resistance state is the stable state. When a certain set voltage is applied to the memory cell MC, the memory cell is allowed to transit from the high-resistance state to the low-resistance state (set state). When a reset voltage lower than the set voltage and having a longer pulse width is applied to the memory cell MC in the low-resistance state, the memory cell is allowed to transit to the high-resistance state through the thermal process (reset operation).

Figure 4:
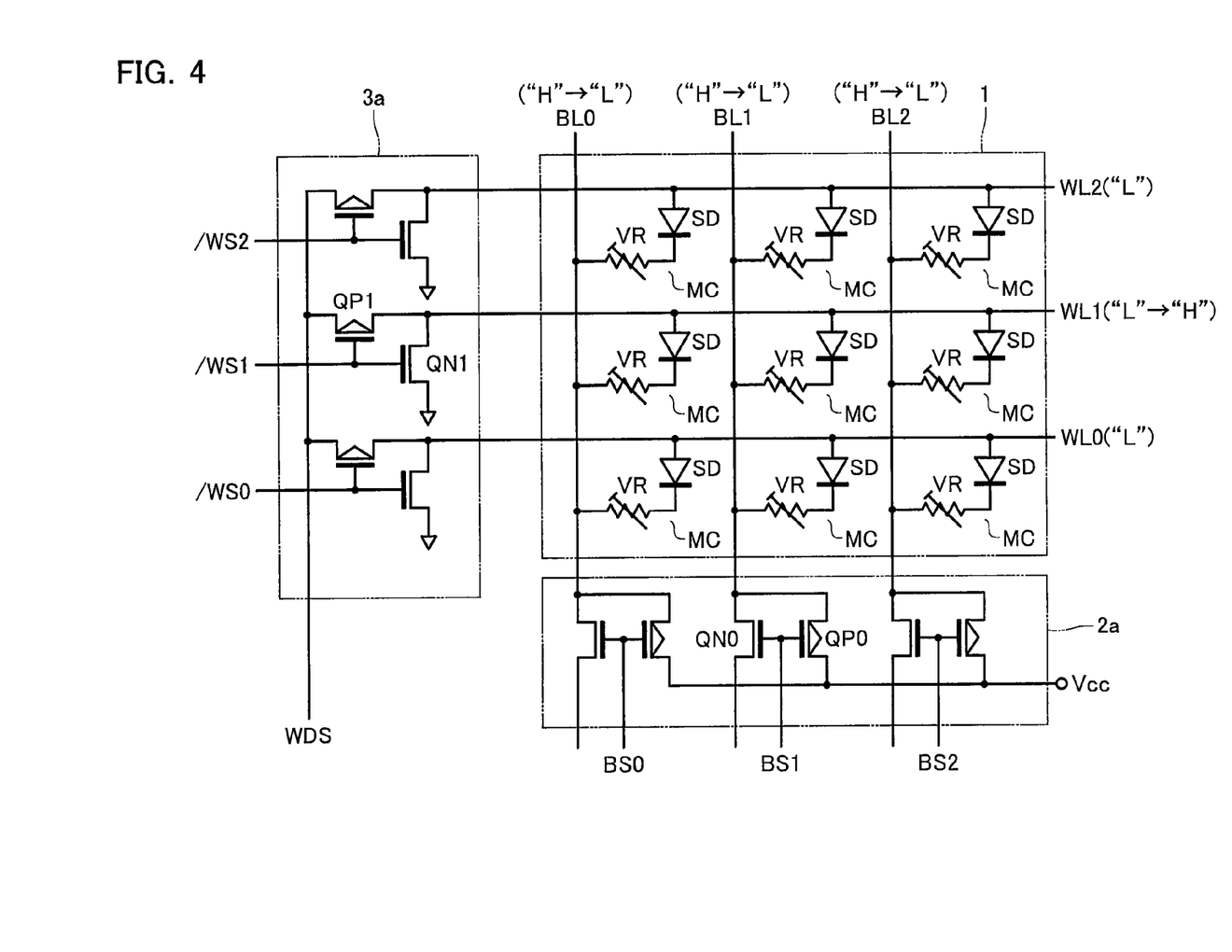
FIG. 4 is a circuit diagram of the memory cell array and peripheral circuits thereof in the semiconductor memory device according to the same embodiment.

FIG. 4 is circuit diagram of the memory cell array 1 using a diode SD as the non-ohmic element NO and peripheral circuits therefor.

In FIG. 4, the diode contained in the memory cell MC has an anode connected to the word line WL and a cathode connected to the bit line BL via the variable resistor VR. Each bit line BL has one end connected to a selection circuit 2a, which is part of the column control circuit 2. Each word line WL has one end connected to a selection circuit 3a, which is part of the word line drive circuit 3.

The selection circuit 2a includes a selection PMOS transistor QP0 and a selection NMOS transistor QN0, provided at each bit line BL, of which gates and drains are commonly connected. The selection PMOS transistor QP0 has a source connected to a high potential source Vcc. The selection NMOS transistor QN0 has a source connected to a circuit in the column control circuit 2, which is used to apply a write pulse and supply a detection current at the time of data read. The transistors QP0, QN0 have a common drain connected to the bit line BL, and a common gate supplied with a bit-line selection signal BSi.

Figure 8:
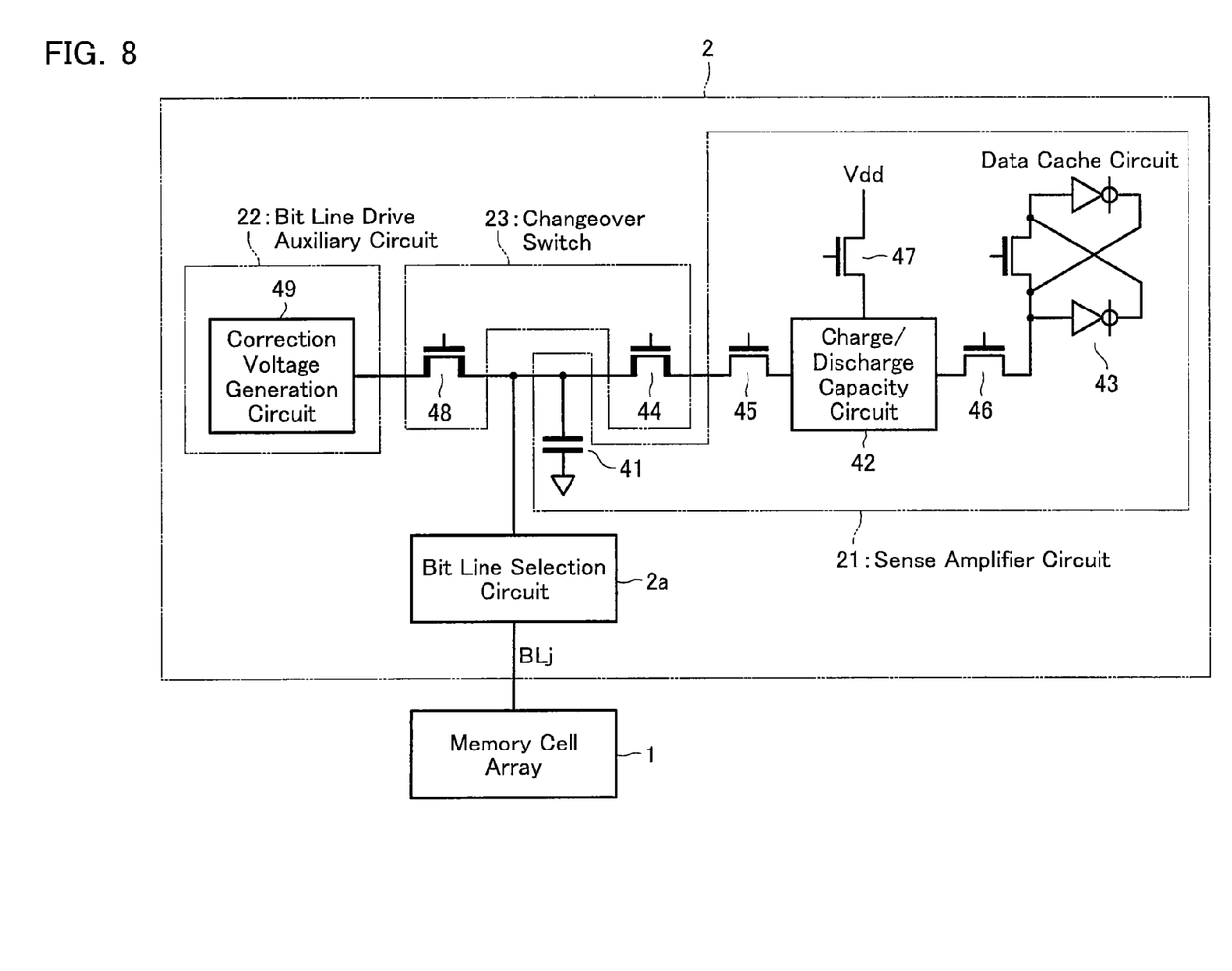
FIG. 8 briefly shows a column control circuit for one bit line in the semiconductor memory device according to the same embodiment.

As described below in detail, the selection circuit 2a is connected via a changeover switch 23 to a sense amplifier circuit 21 or a bit-line drive auxiliary circuit 22. On the basis of bit-line information read out at the sense amplifier circuit 21, a bit-line selection signal BSj is supplied to the gates of the selection transistors QP0, QN0. In this case, the bit line BLj is selected again and the bit line BLj is connected to a correction voltage generation circuit 49.

The selection circuit 3a includes a selection PMOS transistor QP1 and a selection NMOS transistor QN1, provided at each word line WL, of which gates and drains are commonly connected. The selection PMOS transistor QP1 has a source connected to a word-line side drive sense line WDS, which is used to apply a write pulse and supply a detection current at the time of data read. The selection NMOS transistor QN1 has a source connected to the low potential source Vss. The transistors QP1, QN1 have a common drain connected to the word line WL and a common gate supplied with a word-line selection signal /WSi for selecting each word line WL.

[Data Reading and Writing]

Binary data reading/writing is described next.

Figure 5:
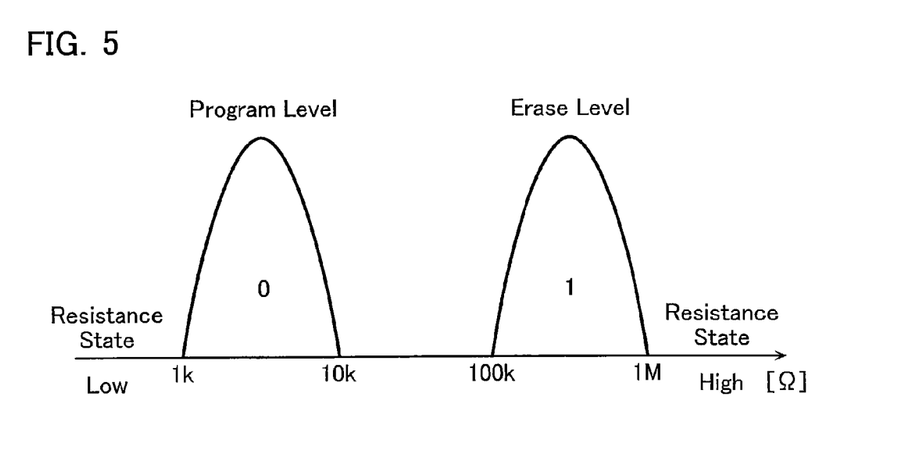
FIG. 5 is a graph showing resistance distributions and data in a memory cell in the case of binary data.

In the above-described circuits, data is stored in each memory cell MC as the resistance of the variable resistor VR. The word-line selection signals /WS0, /WS1, . . . are at "H" level and the bit-line selection signals BS0, BS1, . . . are at "L" level, for example, in the non-selected state. In this case, all word lines WL are set at "L" level and all bit lines BL at "H" level. In the non-selected state, diodes SD in all memory cells MC are reverse-biased and turned off and thus no current flows in the variable resistor VR. Selection of all memory cells MC linked to the word line WL1 is considered herein. In this case, the word line drive circuit 3 sets the word-line selection signal /WS1 at "L" level and the column control circuit 2 sets the bit-line selection signals BS0-BS2 at "H" level. As a result, the word line WL1 is connected to the word-line side drive sense line WDS. Accordingly, application of "H" level to the drive sense line WDS and "L" level to the bit lines BL0-BL2 results in the word line WL1 at "H" level and the bit lines BL0-BL2 at "L" level. Thus, in the selected cell, the diode SD is forward-biased to allow current to flow. The amount of current flowing in the selected cell can be determined from the resistance of the variable resistor VR. Accordingly, by sensing the value of the current, the data can be read out. Namely, by relating the erased high-resistance state to "1" and the programmed low-resistance state to "0" as shown in FIG. 5, the sensed current can be detected as "1" for a small value and as "0" for a large value.

Non-selected word lines WL and the selected bit lines BL0-BL2 are at "L" level and accordingly no current flows in them as well. Therefore, no current flows in other memory cells than the selected memory cell.

Binary data writing is described next.

Figure 6:
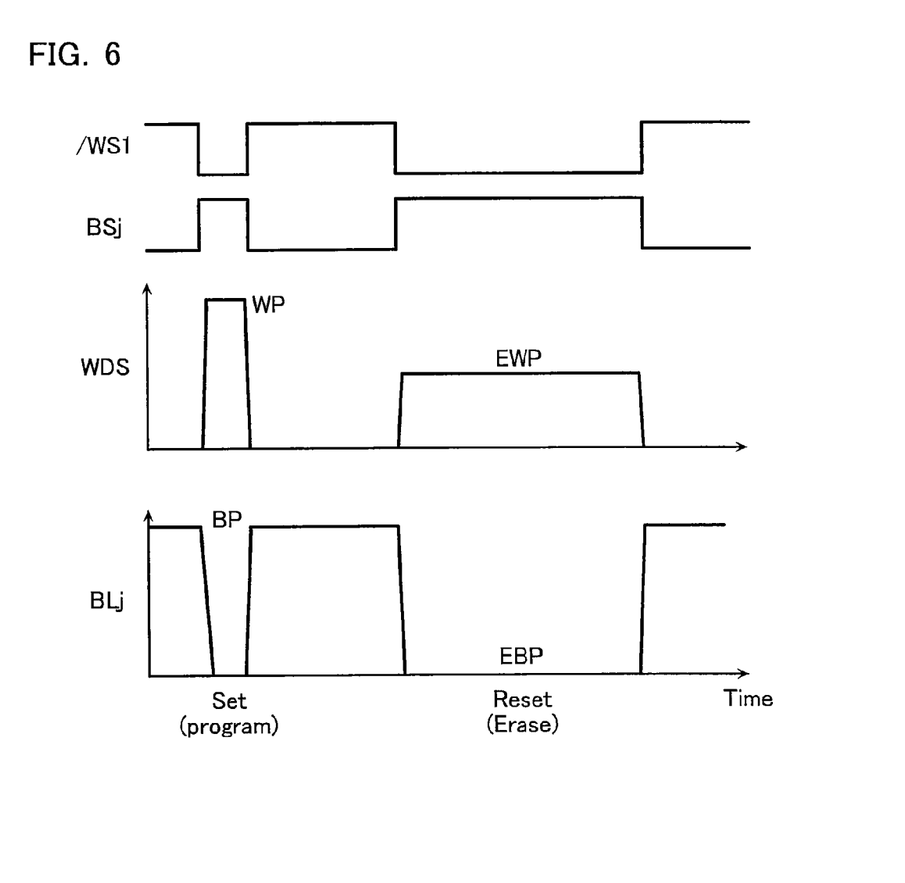
FIG. 6 is a waveform diagram showing selection signals /WS, BS and write pulses WP, BP at the time of data write in the same embodiment.

FIG. 6 is a waveform diagram showing selection signals /WS, BS and write pulses WP, BP applied to drive data lines WDS, BDS at the time of data write. The write pulses WP, BP are generated from the pulse generator 9 that contains a booster circuit.

At the time of data set with a variation from the high-resistance state to the low-resistance state, the word line selection signal /WS1 for the word line WL1 corresponding to a data write target memory cell is set at "L" level. In addition, the bit line selection signals BSj for one or more bit lines BLj corresponding to the write target memory cells are set at "H" level. At the same time, the word-line side drive sense line WDS is given a write pulse WP for varying the resistance of the variable resistor VR from the erase level to the program level as shown in FIG. 5. The write pulse WP is given from the pulse generator 9 shown in FIG. 1 and has a pulse height of, for example, Vcc level. At the same time, the bit line BL is given a negative write pulse BP of Vss level. As a result, the variable resistor VR in the high-resistance state (erased state) can be set in the low-resistance state (programmed state). It should be noted that the selected bit lines BLj may include one connected to a memory cell MC already in the low-resistance state.

At the time of data reset with a variation from the low-resistance state to the high-resistance state, plural memory cells may be erased in batch though each memory cell may be erased individually. In this case, the word line selection signal /WS1 for the word line WL1 corresponding to a data erase target memory cell is kept at "L" level for a longer time than that at the time of set. In addition, the bit line selection signals BSj for one or more bit lines BLj corresponding to the erase target memory cells are kept at "H" level for a longer time than that at the time of set as well. At the time of erase, the memory cell is in the low-resistance state. Accordingly, the word-line side drive sense line WDS is given a lower erase pulse EWP than that at the time of set. In addition, the bit line BL is given a negative erase pulse EBP of Vss level. Thus, a larger current flowing in the variable resistor in the low-resistance state for a longer time causes Joule heat, which can reset the variable resistor to the high-resistance state.

In the foregoing, the voltage drop in the word line WL is not taken into account. In practice, however, as the word line WL is increasingly finely pattered, the influence of the voltage drop can not be neglected.

Figure 7:
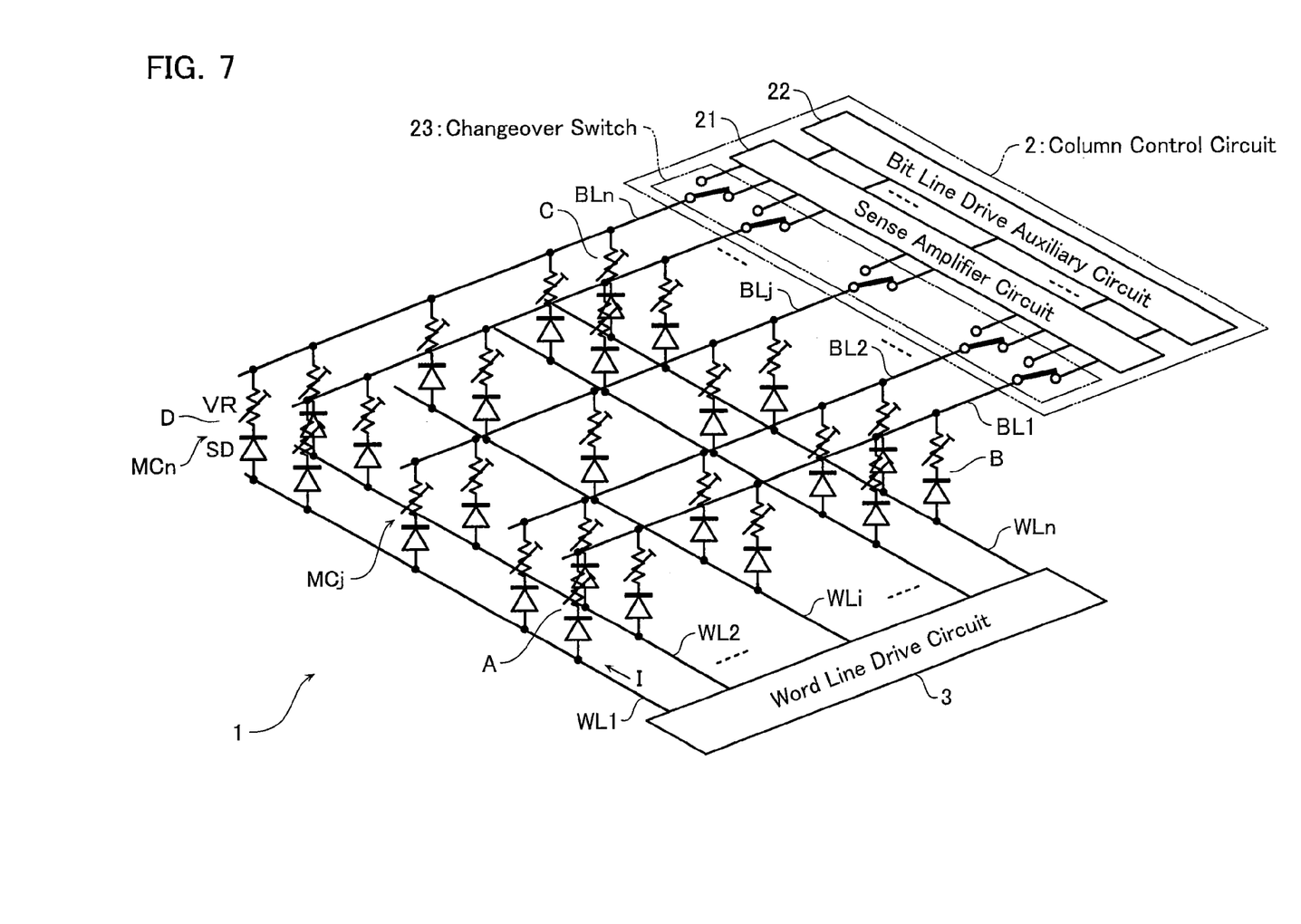
FIG. 7 schematically shows the memory cell array and peripheral circuits thereof in the semiconductor memory device according to the same embodiment.

Such the voltage drop in the memory cell MC inside the memory cell array 1 is described using FIG. 7.

It may be intended to apply a certain voltage V1 at a time to respective variable resistors VR in access-intended memory cells MC1-MCn connected to one word line WL. In this case, the potentials on the bit lines BL1-BLn are set at the ground potential (GND) and the voltage V1 is applied to the word line WL1.

In practice, however, the distances from the word line drive circuit 3 to the memory cells MC1-MCn are different. Accordingly, the influence of the voltage drop lowers the voltage placed across the variable resistors VR in the memory cells MC1-MCn to $V1-I \times Rj$ (where I denotes the current flowing in the word line WL1, and Rj the resistance from the word line drive circuit 3 to the memory cell MCj).

If the variable resistor VR in a memory cell MCj of the accessible memory cells MC1-MCn connected to one word line WL is in the low-resistance state, through-current flows in the memory cell MCj. Accordingly, the current I flowing in the word line WL1 increases and makes the influence of the voltage drop greater.

As a result, the voltages placed across the variable resistors VR in the memory cells MC1-MCn exhibit variations, which make it difficult to store information in the memory cell MC correctly and deteriorate the reliability of the whole semiconductor memory.

[Structure of Column Control Circuit]

The following detailed description is given to a column control circuit 2 for use in the embodiment of the present invention, from which the above point is improved.

FIG. 7 is a schematic circuit diagram showing a configuration of the column control circuit 2 together with peripheral circuits thereof. The column control circuit 2 includes a sense amplifier circuit 21 operative to sense the stored data from the value of current in the bit line BL and store the data. It also includes a bit-line drive auxiliary circuit 22 operative to apply a correction voltage to the bit line BL based on the data read out at the sense amplifier circuit 21. It further includes a changeover switch 23 operative to selectively switch between these circuits 21, 22.

FIG. 8 shows the column control circuit 2 associated with one bit line BLj in more detail.

The sense amplifier circuit 21 includes charge/discharge capacity circuits 41, 42, and a data cache circuit 43. The charge/discharge capacity circuit 41 accumulates charge at a rate in accordance with the value of current flowing in the bit line BLj for a certain period of time selected by the bit line selection circuit 2a. The charge/discharge capacity circuit 42 precharges the capacity for a certain period of time via a precharge MOS transistor 47.

A gate MOS transistor 45 for switching charge/discharge turns on after both the capacity circuits 41, 42 are charged for a certain period of time. The charged voltage in the capacity circuit 41 is a high voltage if the value of current flowing in the bit line BLj is large, and a low voltage if it is small. Accordingly, after the transistor 45 turns on, the charge accumulated in the capacity circuit 42 is retained in the case of the former and discharged to the capacity circuit 41 in the case of the latter. Therefore, if the memory cell MC linked to the bit line BLj is in the low-resistance state, the potential on the charge/discharge capacity circuit 42 is "H", and if it is in the high-resistance state, the potential on the charge/discharge capacity circuit 42 is "L". The potential information is transferred to the data cache circuit 43 by turning on a data transfer gate MOS transistor 46. The data cache circuit 43 may comprise a flip-flop circuit capable of storing this information. The data cache circuit 43 is described as part of the sense amplifier circuit 21 though it may be provided in another region on the semiconductor substrate.

In response to the information transferred from the data cache circuit 43, the bit-line drive auxiliary circuit 22 drives a correction voltage generation circuit 49 and the changeover switch drives a gate MOS transistor 48. The correction voltage generation circuit 49 generates a correction voltage for compensating for the voltage drop caused by the through-current flowing in the memory cell in the low-resistance state. The correction voltage is applied via the bit line selection circuit 2a to the bit line BLj of which voltage is to be corrected.

The bit line BLj of which voltage is to be corrected is not limited to one but may be plural. At least one of the gate MOS transistor 44 and the gate MOS transistor 48 is always turned off and thus both cannot turn on at the same time. Namely, the changeover switch 23 including two gate MOS transistors 44, 48 switches the connection of the bit line selection circuit 2a to either the sense amplifier circuit 21 or the bit-line drive auxiliary circuit 22.

[Embodiment of Memory Cell Voltage Application Method]

The following detailed description is given to a memory cell voltage application method according to one embodiment of the present embodiment.

Figure 9:
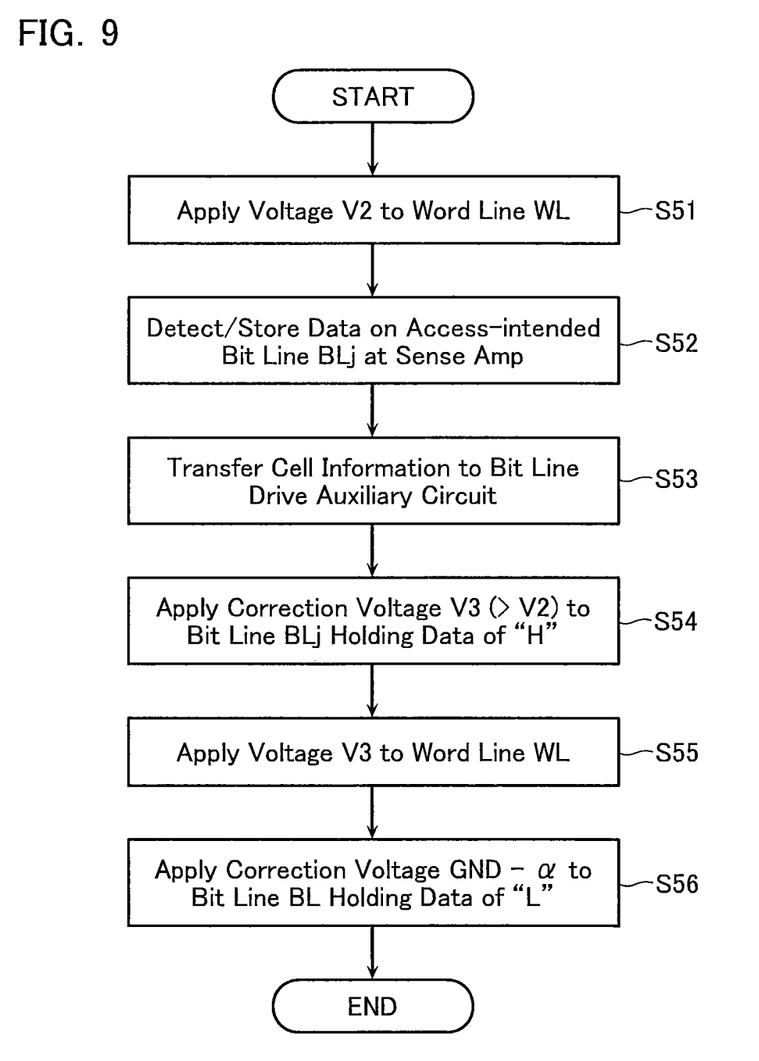
FIG. 9 is a flowchart illustrating a memory cell voltage application method according to one embodiment of the present embodiment.

FIG. 9 is a flowchart illustrating the memory cell voltage application method according to the embodiment. The present embodiment relates to a method for storing information correctly in a memory cell MCn in the reset state to bring it into the set state.

First, in the process 1, the word line drive circuit 3 selects one word line WL1 and applies a voltage V2 to the word line WL1 (step 51). The voltage V2 is a voltage for read, which may be same as or different from the voltage V1.

Next, in the process 2, the bit line drive circuit 2a selects all bit lines BLj connected to the set-intended memory cell MC and turns on the gate MOS transistor 44 for switching the sense amplifier circuit in the changeover switch 23 (FIG. 8). Thereafter, it supplies a current pulse for read to the bit lines BLj and the sense amplifier circuit 21 detects the value of current in the bit lines BLj and stores the data (step 52).

Next, in the process 3, the information stored in the data cache circuit 43 is transferred to the changeover switch 23 and the bit-line drive auxiliary circuit 22 (step 53). At the same time, the gate MOS transistor 44 for switching the sense amplifier circuit in the changeover switch 23 is turned off. In addition, the gate MOS transistor 48 for switching the bit-line drive auxiliary circuit in the changeover switch 23 associated with access-intended the bit line BLj is turned on. As a result, the connection to the bit line Blj can be switched from the sense amplifier circuit 21 to the bit-line drive auxiliary circuit 22.

Next, in the process 4, the correction voltage generation circuit 49 generates a voltage V3 (V3>V2), which is applied to the bit line BLj of which data stored in the data cache circuit 43 is "H" (step 54). Thus, the diode SD in the memory cell MCj is reverse-biased to prevent a through-current from flowing.

V3 is a voltage capable of varying device information on the variable resistor VR in a desired memory cell MCn. A variation in device information on the memory cell MCn requires application of the voltage V3 (V3>V2) capable of changing the physical state of the variable resistor VR in the memory cell MCn (that is, causing a variation in resistance). Therefore, the potential on the bit line BLj connected to the memory cell MCn in the low-resistance state is elevated to V3 by the bit-line drive auxiliary circuit 22. Thus, the diode SD in the memory cell MCj is large reverse-biased to prevent a through-current from flowing.

Next, in the process 5, the word line drive circuit 3 is used to selectively apply the pulse voltage V3 for write to the word line WL1 (step 55).

Next, in the process 6, to a bit line BLj of which data stored in the data cache 43 is "L", of the access-intended bit lines BLj, a pulse voltage for write (GND-α) generated at the above-described pulse generator 9 is applied (step 56). In this case, α is a correction voltage for compensating for the voltage drop in the word line WL1 and a can be determined from the physical address of the memory cell MCn. For example, it can be calculated easily from the standard current value I when all memory cells MC connected to the word line WL are in the high-resistance state, multiplied by the standard resistance R of the word line WL determined from the physical address of the memory cell MC. Besides, α can be determined from the values of current in memory cells MC at four locations A, B, C, D (FIG. 7) contained in a unit cell array, which are monitored at the time of test and stored in ROM fuses.

In accordance with the memory cell voltage application method according to the present embodiment, the voltage drop in the memory cell can be effectively compensated for. Thus, the correct voltage required for shifting the variable resistor VR in the memory cell MC from the reset state to the set state can be applied to the concerned variable resistor VR. As a result, the reliability of data in the whole semiconductor memory can be improved.

[Others]

The embodiments of the invention are described above though the present invention is not limited to these embodiments but rather can be given various modifications and additions without departing from the scope and spirit of the invention. For example, the value of the voltage drop α may be varied in accordance with the number of penetrated memory cells connected to the word line and the leakage current thereof and may be applied in a self-aligned manner in circuitry. Instead of applying a voltage at the potential of changing the physical state of the variable resistor VR to the word line and applying a voltage at the voltage-drop-compensated potential of GND—α to the bit line, applying a voltage at the potential of changing the physical state of the variable resistor VR+the potential of α to the word line and fixing the potential on the bit line to GND can exert the same effect.

The invention claimed is:

1. A semiconductor memory device, comprising:
   a plurality of parallel word lines;
   a plurality of parallel bit lines formed crossing said plurality of word lines;
   a plurality of memory cells arranged at intersections of said word lines and said bit lines, each memory cell having one end connected to one of said plurality of word lines and the other end connected to one of said plurality of bit lines; and a control circuit operative to perform a read operation and a write operation, wherein
said control circuit is configured to read out data from one memory cell of said memory cells,
if said data read out is a first level, said control circuit applies a first voltage to one bit line of said plurality of parallel bit lines,
if said data read out is a second level, said control circuit applies a second voltage generated based on a physical address of said memory cell to said bit line,
said control circuit has a column control circuit and a word line drive circuit,
said word line drive circuit is configured to apply a third voltage to one word line of said plurality of parallel word lines, and
said second voltage is lower than said third voltage.

2. The semiconductor memory device according to claim 1, further comprising:
a storage circuit, wherein
said control circuit includes a sense amplifier circuit and a bit-line drive auxiliary circuit, and is configured to store said data read out by said sense amplifier circuit to said storage circuit, and
said bit-line drive auxiliary circuit selectively adjusts a potential on said bit line based on said data stored in said storage circuit.

3. The semiconductor memory device according to claim 2, wherein
one, or two or more of said bit lines have their potential adjusted by said bit-line drive auxiliary circuit.

4. The semiconductor memory device according to claim 2, wherein
said bit-line drive auxiliary circuit supplies a correction voltage to said bit line to selectively adjust the potential on said bit line, said correction voltage being determined based on a physical address of said memory cell.

5. The semiconductor memory device according to claim 2, wherein
said sense amplifier circuit includes a first charge/discharge capacity circuit operative to accumulate charge in accordance with current flowing in a certain memory cell for a certain period of time, and a second charge/discharge capacity circuit operative to accumulate a certain charge for a certain period of time, wherein if a charged voltage on said second charge/discharge capacity circuit is larger than a charged voltage on said first charge/discharge capacity circuit after said certain period of time, the charge in said second charge/discharge capacity circuit is supplied to said first charge/discharge capacity circuit, and if smaller, the charge in said second charge/discharge capacity circuit is retained, and then the charged voltage on said second charge/discharge capacity circuit is stored in said storage circuit.

6. The semiconductor memory device according to claim 1, wherein
each of said memory cells includes a variable resistor operative to store a reversibly settable resistance as data, and a diode serially connected to said variable resistor.

7. The semiconductor memory device according to claim 1, further comprising:
a fuse arranged to store a previously measured value of current in a certain memory cell, wherein
said bit-line drive auxiliary circuit supplies a correction voltage to said bit line to selectively adjust the potential on said bit line, said correction voltage being determined based on data of said fuse.

8. The semiconductor memory device according to claim 1, wherein
said control circuit includes a sense amplifier circuit and a bit-line drive auxiliary circuit,
said sense amplifier circuit includes a storage circuit operative to store data read out, and
said bit-line drive auxiliary circuit selectively adjusts a potential on said bit line based on data stored in said storage circuit.

9. The semiconductor memory device according to claim 1, wherein
said first voltage is equal to said third voltage.

10. The semiconductor memory device according to claim 1, wherein
said second voltage is lower than said first voltage.

11. The semiconductor memory device according to claim 1, wherein
said control circuit reads out data from said memory cell in a set operation.

12. The semiconductor memory device according to claim 1, wherein
said control circuit reads out data from said memory cell in a reset operation.

13. A semiconductor memory device, comprising:
a plurality of parallel word lines;
a plurality of parallel bit lines formed crossing said plurality of word lines;
a plurality of memory cells arranged at intersections of said word lines and said bit lines, each memory cell having one end connected to one of said plurality of word lines and the other end connected to one of said plurality of bit lines; and
a control circuit operative to perform a read operation and a write operation, wherein
said control circuit is configured to read out data from said plurality of memory cells,
if said data read out is a first level, said control circuit applies a first voltage to said plurality of bit lines connected to said memory cells storing said first level, and
if said data read out is a second level, said control circuit applies a second voltage generated based on physical addresses of said memory cells to said plurality of bit lines connected to said memory cells storing said second level,
said control circuit has a column control circuit and a word line drive circuit,
said word line drive circuit is configured to apply a third voltage to one word line of said plurality of parallel word lines, and
said second voltage is lower than said third voltage.

14. The semiconductor memory device according to claim 13, wherein
said first voltage is equal to said third voltage.

15. The semiconductor memory device according to claim 13, wherein
said second voltage is lower than said first voltage.

16. The semiconductor memory device according to claim 13, wherein
said control circuit reads out data from said memory cells in a set operation.

17. The semiconductor memory device according to claim 13, wherein
said control circuit reads out data from said memory cells in a reset operation.

* * * * *